US012753485B2

(12) United States Patent
Okoshi et al.

(10) Patent No.: US 12,753,485 B2
(45) Date of Patent: Oct. 6, 2026

(54) FILM FORMING METHOD AND FILM FORMING APPARATUS

(71) Applicant: Tokyo Electron Limited, Tokyo (JP)

(72) Inventors: Ken Okoshi, Yamanashi (JP); Yamato Tonegawa, Yamanashi (JP); Jun Ogawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 51 days.

(21) Appl. No.: 18/515,610

(22) Filed: Nov. 21, 2023

(65) Prior Publication Data

US 2024/0175117 A1 May 30, 2024

(30) Foreign Application Priority Data

Nov. 30, 2022 (JP) ................................ 2022-192040

(51) Int. Cl.

| | |
|---|---|
| ***C23C 14/12*** | (2006.01) |
| ***C23C 14/02*** | (2006.01) |
| ***C23C 14/54*** | (2006.01) |
| ***C23C 14/58*** | (2006.01) |
| ***H01J 37/32*** | (2006.01) |

(52) U.S. Cl.

CPC .............. *C23C 14/12* (2013.01); *C23C 14/02* (2013.01); *C23C 14/54* (2013.01); *C23C 14/5826* (2013.01); *H01J 37/32449* (2013.01); *H01J 2237/327* (2013.01); *H01J 2237/3321* (2013.01)

(58) Field of Classification Search

None

See application file for complete search history.

(56) References Cited

U.S. PATENT DOCUMENTS

2016/0079056 A1* 3/2016 Harada ............ H01J 37/32449 118/725

2022/0235460 A1* 7/2022 Tuominen ............ C23C 16/509

FOREIGN PATENT DOCUMENTS

JP 2016-063007 4/2016

* cited by examiner

*Primary Examiner* — Shamim Ahmed

*Assistant Examiner* — Bradford M Gates

(74) *Attorney, Agent, or Firm* — IPUSA, PLLC

(57) ABSTRACT

A film forming method includes performing a process including a) and b) a plurality of times, with a) being performed before b) in the process: a) supplying borazine-based gas to a substrate, thereby adsorbing the borazine-based gas to the substrate and b) exposing the substrate to a nitrogen plasma.

7 Claims, 9 Drawing Sheets

FILM FORMING METHOD AND FILM FORMING APPARATUS

CROSS-REFERENCE TO RELATED APPLICATIONS

This application is based upon and claims priority to Japanese Patent Application No. 2022-192040, filed on Nov. 30, 2022, the entire contents of which are incorporated herein by reference.

BACKGROUND

1. Field of the Invention

The present disclosure relates to film forming methods and film forming apparatuses.

2. Description of the Related Art

In, for example, Japanese Laid-Open Patent Publication No. 2016-63007, a technique of forming boron nitride including a borazine cyclic skeleton is known.

SUMMARY

According to one aspect of the present disclosure, a film forming method includes performing a process including a) and b) a plurality of times, with a) being performed before b) in the process: a) supplying borazine-based gas to a substrate, thereby adsorbing the borazine-based gas to the substrate and b) exposing the substrate to a nitrogen plasma.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

The present disclosure provides a technique of forming a film including a boron atom and a nitrogen atom at a low temperature.

Hereinafter, non-limiting embodiments of the present disclosure will be described with reference to the attached drawings. Throughout the attached drawings, the same or corresponding members or parts are designated by the same or corresponding reference symbols, and duplicate description thereof will be omitted.

Film Forming Method

Figure 1:
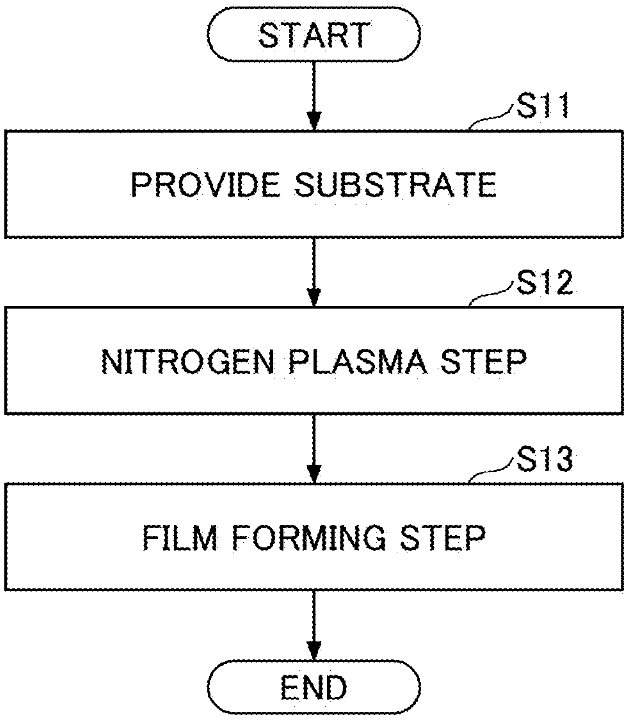
FIG. 1 is a flowchart illustrating a film forming method according to an embodiment.
Figure 2:
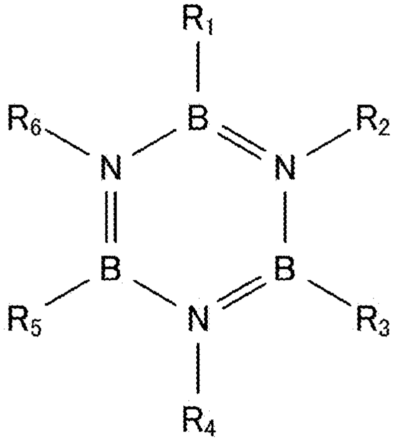
FIG. 2 is a sketch of a structural formula of borazine-based gas used in the film forming method of FIG. 1.
Figure 3:
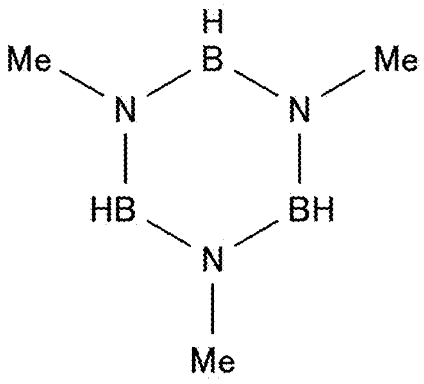
FIG. 3 is a sketch of a structural formula of borazine-based gas used in the film forming method of FIG. 1.

The film forming method according to the embodiment will be described with reference to FIG. 1 to FIG. 3. FIG. 1 is a flowchart illustrating the film forming method according to the embodiment. FIG. 2 and FIG. 3 are each a sketch of the structural formula of the borazine-based gas used in the film forming method of FIG. 1. As illustrated in FIG. 1, the film forming method according to the embodiment includes providing step S11, nitrogen plasma step S12, and film forming step S13.

Providing step S11 includes providing a substrate. The substrate may be, for example, a semiconductor wafer. The substrate may include, in a surface thereof, a recessed portion such as a trench, a hole, or the like.

Nitrogen plasma step S12 is performed after providing step S11. Nitrogen plasma step S12 includes exposing the substrate to a nitrogen ($N_2$) plasma, thereby generating a N group (—N) on the surface of the substrate. Nitrogen plasma step S12 may include generating the nitrogen plasma by supplying nitrogen ($N_2$) gas into a process chamber housing the substrate, and supplying a RF power to an electrode provided in the process chamber. Nitrogen plasma step S12 may include maintaining the substrate at a temperature that is 200° C. or higher and 700° C. or lower.

Film forming step S13 is performed after nitrogen plasma step S12. Film forming step S13 includes forming a film on the surface of the substrate using the borazine-based gas, the film including a boron (B) atom and a nitrogen (N) atom. The film including the boron atom and the nitrogen atom may be a boron nitride (BN) film. The borazine-based gas may be gas obtained by vaporizing an alkylborazine compound represented by the structural formula of FIG. 2. In the structural formula of FIGS. 2, $R_1$ to $R_6$ are each a hydrogen (H) atom or an alkyl group having 4 or less carbon (C) atoms. $R_1$ to $R_6$ may be the same alkyl group or may be different alkyl groups. One example of the borazine-based gas is 1,3,5-trimethylborazine gas (TMB gas) having the structural formula of FIG. 3.

Through the above steps, the film including the boron atom and the nitrogen atom is formed on the surface of the substrate. Note that, nitrogen plasma step S12 may be omitted.

Figure 4:
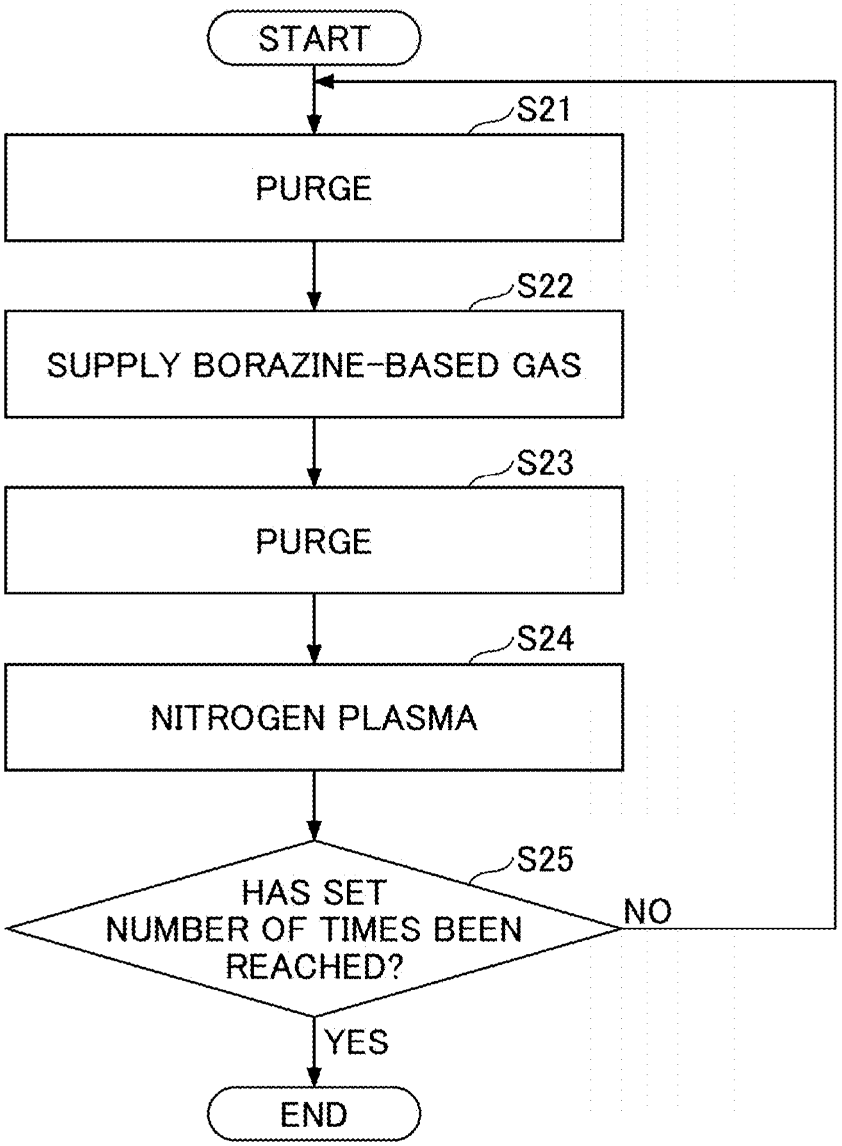
FIG. 4 is a flowchart illustrating a film forming step.

Film forming step S13 will be described with reference to FIG. 4. FIG. 4 is a flowchart illustrating film forming step S13. As illustrated in FIG. 4, film forming step S13 includes purging step S21, borazine-based gas supplying step S22, purging step S23, nitrogen plasma step S24, and determining step S25.

Purging step S21 includes supplying inert gas to the surface of the substrate, thereby purging the surface of the substrate. The inert gas may be nitrogen gas. The inert gas may be rare gas, such as helium (He) gas, argon (Ar) gas, or the like. Purging step S21 may include supplying the inert gas into the process chamber housing the substrate.

Borazine-based gas supplying step S22 is performed after purging step S21. Borazine-based gas supplying step S22 includes supplying the borazine-based gas to the surface of the substrate, thereby adsorbing the borazine-based gas to the surface of the substrate. At this time, when the N group is present on the surface of the substrate, the borazine-based gas is readily adsorbed to the surface of the substrate at a low temperature. This is likely because of low activation energy for adsorption reaction of the borazine-based gas to the surface on which the N group is present. Borazine-based gas supplying step S22 may include supplying the borazine-based gas into the process chamber housing the substrate. Borazine-based gas supplying step S22 may include maintaining the substrate at a temperature that is 200° C. or higher and 700° C. or lower. At the temperature of 200° C. or higher, the borazine-based gas is readily adsorbed to the surface of the substrate. At the temperature of 700° C. or lower, hardly any of the B—N bonds included in the alkylborazine compound are cut, and thus the borazine-based gas maintaining the borazine cyclic skeleton is readily adsorbed to the surface of the substrate.

Purging step S23 is performed after borazine-based gas supplying step S22. Purging step S23 includes supplying inert gas to the surface of the substrate, thereby purging the surface of the substrate. The inert gas may be the same as the inert gas used in purging step S21. Purging step S23 may include supplying the inert gas into the process chamber housing the substrate.

Nitrogen plasma step S24 is performed after purging step S23. Nitrogen plasma step S24 includes exposing the substrate to a nitrogen plasma, thereby generating a N group on the surface of the substrate. In this case, in borazine-based gas supplying step S22 performed after nitrogen plasma step S24, the borazine-based gas is adsorbed to the surface of the substrate at a low temperature. This is likely because of low activation energy for adsorption reaction of the borazine-based gas to the surface on which the N group is present. Note that, when the substrate is exposed to an ammonia ($NH_3$) plasma instead of the nitrogen plasma, a $NH_2$ group (—$NH_2$) is formed on the surface of the substrate. The activation energy for the adsorption reaction of the borazine-based gas to the surface on which the $NH_2$ group is present is greater than the activation energy for the adsorption reaction of the borazine-based gas to the surface on which the N group is present. Therefore, the borazine-based gas is not readily adsorbed to the surface of the substrate at a low temperature. Nitrogen plasma step S24 may include generating the nitrogen plasma by supplying the nitrogen gas into the process chamber housing the substrate, and supplying the RF power to the electrode provided in the process chamber. Nitrogen plasma step S24 may include maintaining the substrate at a temperature that is 200° C. or higher and 700° C. or lower. Nitrogen plasma step S24 may include supplying the borazine-based gas for an initial part of a period of nitrogen plasma step S24. In this case, the adsorption of the borazine-based gas to the surface of the substrate is promoted, and a film forming speed is increased.

Determining step S25 is performed after nitrogen plasma step S24. Determining step S25 includes determining whether or not a process from purging step S21 to nitrogen plasma step S24 has been performed a set number of times. When the process is not performed the set number of times ("NO" in determining step S25), the process from purging step S21 to nitrogen plasma step S24 is performed again. When the process is performed the set number of times ("YES" in determining step S25), film forming step S13 ends. In this way, the process from purging step S21 to nitrogen plasma step S24 performed in order is performed a plurality of times until the process is performed the set number of times, thereby forming the film including the boron atom and the nitrogen atom on the surface of the substrate.

According to the above-described film forming method according to the embodiment, the process including repeating borazine-based gas supplying step S22 and nitrogen plasma step S24 in order is performed the plurality of times. In this case, the N group is formed on the surface of the substrate in nitrogen plasma step S24, and in the subsequent borazine-based gas supplying step S22, the borazine-based gas is adsorbed to the surface of the substrate at a low temperature. Therefore, it is possible to form the film including the boron atom and the nitrogen atom at a low temperature.

Figure 5:
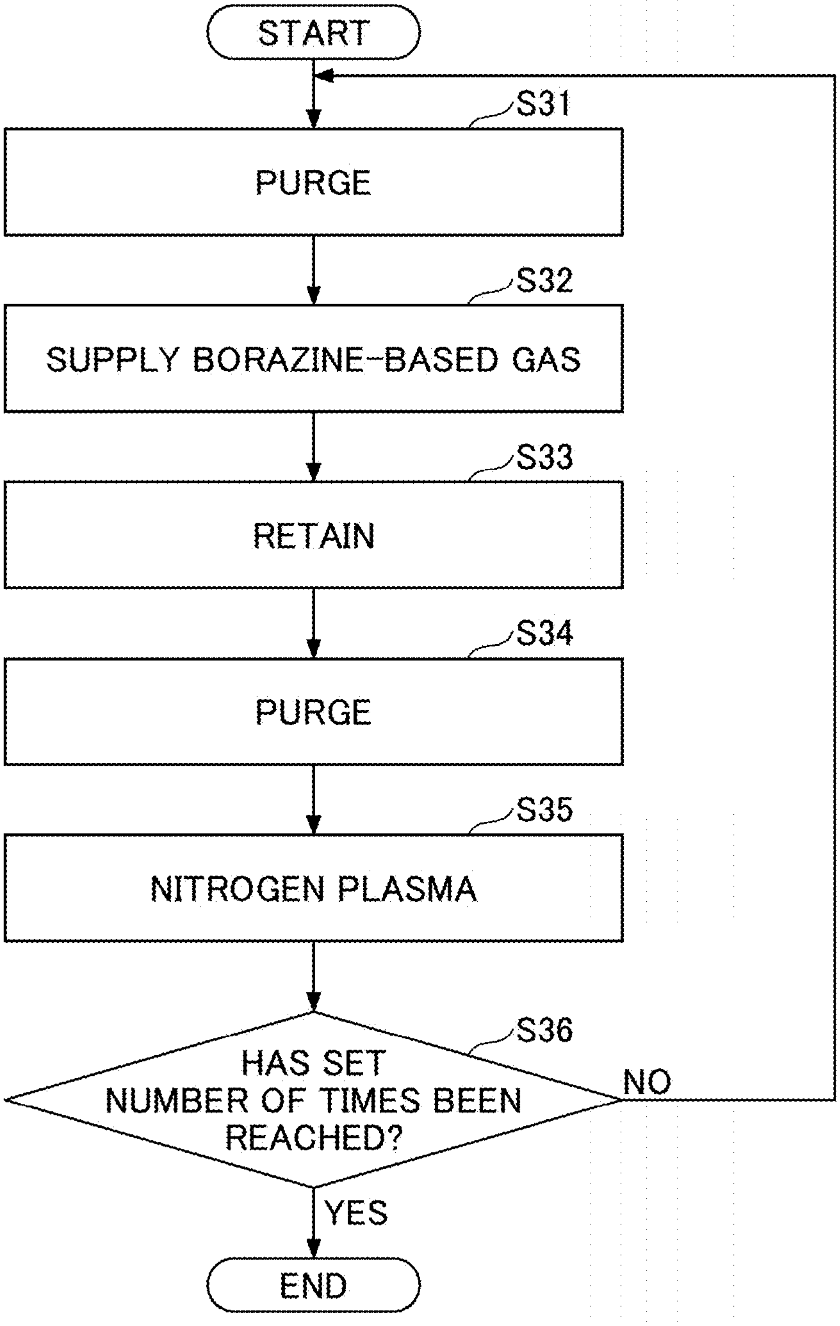
FIG. 5 is a flowchart illustrating a modified example of the film forming step.

A modified example of film forming step S13 will be described with reference to FIG. 5. FIG. 5 is a flowchart illustrating the modified example of film forming step S13. As illustrated in FIG. 5, film forming step S13 includes purging step S31, borazine-based gas supplying step S32, retention step S33, purging step S34, nitrogen plasma step S35, and determining step S36.

Purging step S31, borazine-based gas supplying step S32, purging step S34, nitrogen plasma step S35, and determining step S36 are the same as purging step S21, borazine-based gas supplying step S22, purging step S23, nitrogen plasma step S24, and determining step S25, respectively.

Retention step S33 is performed between borazine-based gas supplying step S32 and purging step S34. Retention step S33 includes retaining a state where supply of the borazine-based gas into the process chamber housing the substrate and discharge of the borazine-based gas from the process chamber are stopped. In this case, the substrate is exposed to the borazine-based gas with the process chamber being filled with the borazine-based gas, and thus the adsorption of the borazine-based gas to the surface of the substrate is promoted.

Film Forming Apparatus

Figure 6:
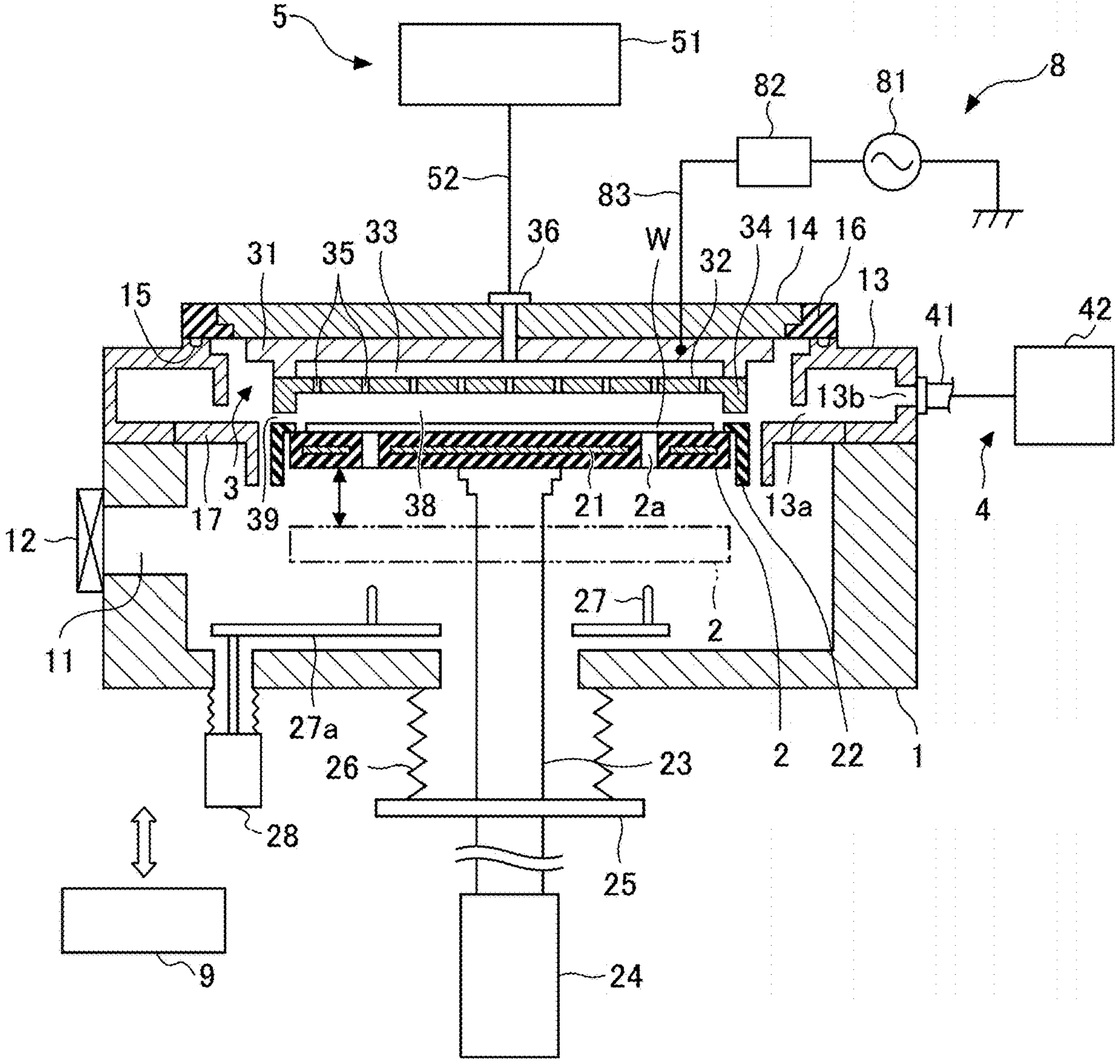
FIG. 6 is a schematic view illustrating a film forming apparatus according to an embodiment.

One example of the film forming apparatus according to the embodiment will be described with reference to FIG. 6. As illustrated in FIG. 6, the film forming apparatus includes a process chamber 1, a stage 2, a shower head 3, an exhauster 4, a gas supply 5, a RF power supply 8, and a controller 9.

The process chamber 1 is formed of a metal such as aluminum and has an approximately cylindrical shape. The process chamber 1 houses a substrate W. The lateral wall of the process chamber 1 is provided with a transfer port 11 through which the substrate W is transferred into or out of the process chamber 1. The transfer port 11 is opened or closed by a gate valve 12. In the upper portion of the body of the process chamber 1, a circular exhaust duct 13 having a rectangular cross section is provided. The exhaust duct 13 is provided with a slit **13*a* along the inner circumferential surface thereof. The outer wall of the exhaust duct 13 is provided with an exhaust port 13*b*. The upper surface of the exhaust duct 13 is provided via an insulating member 16 with a ceiling wall 14 so as to cover the upper opening of the process chamber 1. A sealing ring 15 creates an airtight seal the exhaust duct 13 and the insulating member 16. A partition member 17 partitions the interior of the process chamber 1 between an upper space and a lower space when the stage 2 (and a cover member 22**) has ascended to a processing position as described below.

The stage 2 horizontally supports the substrate W in the process chamber 1. The stage 2 is formed to have a circular plate shape that is large commensurately with the substrate W, and is supported by a support 23. The stage 2 is formed of a ceramic material such as aluminum nitride (AlN) or a metal material such as aluminum or nickel alloy. In the interior of the stage 2, a heater 21 configured to heat the substrate W is embedded. The heater 21 generates heat in response to supply of a power from an unillustrated heater power source. By controlling an output of the heater 21 by a temperature signal of an unillustrated thermocouple provided near the upper surface of the stage 2, the substrate W is controlled to a predetermined temperature. The stage 2 is provided with the cover member 22 that is formed of ceramics such as alumina so as to cover the outer circumferential region of the upper surface and the lateral surface.

The bottom surface of the stage 2 is provided with the support 23 configured to support the stage 2. The support 23 passes through a hole formed in the bottom wall of the process chamber 1 and extends downward of the process chamber 1 from the center of the bottom surface of the stage 2, and the lower end of the support 23 is connected to an ascending and descending mechanism 24. By the ascending and descending mechanism 24, the stage 2 ascends and descends via the support 23 between the processing position as illustrated in FIG. 6 and a transfer position thereunder, denoted by a two-dot chain line, at which the substrate W can be transferred. Below the support 23 in the process chamber 1, a flange 25 is attached. Between the bottom surface of the process chamber 1 and the flange 25, a bellows 26 is provided. The bellows 26 is configured to separate the atmosphere in the process chamber 1 from the outer atmosphere and stretch in response to ascending and descending movements of the stage 2.

Near the bottom surface of the process chamber 1, three support pins 27 (only two of which are illustrated) are provided so as to project upward from an ascending and descending plate 27*a*. The support pins 27 ascend or descend via the ascending and descending plate 27*a* by an ascending and descending mechanism 28 provided below the process chamber 1. The support pins 27 are inserted into through-holes 2*a* provided in the stage 2 located at the transfer position, and can project or recess with respect to the upper surface of the stage 2. By ascending or descending the support pins 27, delivery of the substrate W is performed between an unillustrated transfer mechanism and the stage 2.

The shower head 3 is configured to supply a shower of process gas into the process chamber 1. The shower head 3 is formed of a metal and provided so as to face the stage 2, and has an approximately the same diameter as the diameter of the stage 2. The shower head 3 includes a body 31 and a shower plate 32. The body 31 is fixed to the ceiling wall 14 of the process chamber 1. The shower plate 32 is connected to the lower portion of the body 31. Between the body 31 and the shower plate 32, a gas diffusion space 33 is formed. The gas diffusion space 33 is provided with a gas introducing hole 36 so as to penetrate the center of the ceiling wall 14 of the process chamber 1 and the body 31. The circumferential end of the shower plate 32 is provided with a circular projection 34 projecting downward. The inner flat portion of the circular projection 34 is provided with a gas discharge hole 35. In a state where the stage 2 is located at the processing position, a processing space 38 is formed between the stage 2 and the shower plate 32, and the upper surface of the cover member 22 and the circular projection 34 come close to each other to form a circular gap 39.

The exhauster 4 is configured to exhaust the gas in the process chamber 1. The exhauster 4 includes an exhaust tube 41 and an exhaust mechanism 42. The exhaust tube 41 is connected to the exhaust port 13*b*. The exhaust mechanism 42 includes a vacuum pump connected to the exhaust tube 41, a pressure control valve, and the like. Upon processing, the gas in the process chamber 1 reaches the exhaust duct 13 through the slit 13*a*, and passes through the exhaust tube 41 from the exhaust duct 13 and is discharged by the exhaust mechanism 42.

The gas supply 5 is configured to supply various process gases to the shower head 3. The gas supply 5 includes a gas source 51 and a gas line 52. The gas source 51 includes unillustrated supply sources for various process gases, unillustrated mass flow controllers, unillustrated valves, and the like. The various process gases include the gases used in the above-described film forming method according to the embodiment. The various process gases include the borazine-based gas, the nitrogen gas, the inert gas, and the like. The various process gases are introduced from the gas source 51 to the gas diffusion space 33 through the gas line 52 and the gas introducing hole 36.

The film forming apparatus is a capacitively coupled plasma device, and the stage 2 serves as a lower electrode and the shower head 3 serves as an upper electrode. The stage 2 is grounded via an unillustrated capacitor. The stage 2 may be grounded via no capacitor, or may be grounded via a circuit in which a capacitor and a coil are combined. The shower head 3 is connected to the RF power supply 8.

The RF power supply 8 is configured to supply a RF power to the shower head 3. The RF power supply 8 includes a RF power source 81, a matching device 82, and a power supply line 83. The RF power source 81 is a power source configured to generate the RF power. The RF power has a frequency that is suitable for generation of a plasma. The frequency of the RF power is, for example, a frequency in the range of from 450 KHz in the low-frequency band to 2.45 GHz in the microwave band. The RF power source 81 is connected to the body 31 of the shower head 3 via the matching device 82 and the power supply line 83. The matching device 82 includes a circuit configured to match a load impedance with an internal impedance of the RF power source 81. Note that, the RF power supply 8 has been described as a RF power supply configured to supply the RF power to the shower head 3 serving as the upper electrode; however, this is by no means a limitation. The RF power supply 8 may be configured to supply the RF power to the stage 2 serving as the lower electrode.

The controller 9 is, for example, a computer, and includes a central processing unit (CPU), a random access memory (RAM), a read only memory (ROM), an auxiliary storage device, and the like. The CPU is driven in accordance with a program stored in the ROM or the auxiliary storage device, and controls the film forming apparatus. The controller 9 may be provided internally or externally of the film forming apparatus. When the controller 9 is provided externally of the film forming apparatus, the controller 9 controls driving of the film forming apparatus via a communication unit configured to function by wire, wirelessly, or the like.

Driving of Film Forming Apparatus

Driving of the above-described film forming apparatus that performs the film forming method according to the embodiment will be described.

First, the controller 9 controls the ascending and descending mechanism 24 and descends the stage 2 to the transfer position, and in this state, opens the gate valve 12. Subsequently, the substrate W is transferred into the process chamber 1 through the transfer port 11 by an unillustrated transfer arm, and placed on the stage 2 that has been heated to a set temperature by the heater 21. The set temperature may be, for example, 200° C. or higher and 700° C. or lower.

After the substrate W has been placed on the stage 2, the stage 2 may be heated to the set temperature by the heater 21. Subsequently, the controller 9 controls the ascending and descending mechanism 24 and ascends the stage 2 to the processing position, and vacuums the interior of the process chamber 1 to a predetermined degree of vacuum by the exhaust mechanism 42.

Next, the controller 9 controls the components of the film forming apparatus so as to perform nitrogen plasma step S12. For example, the controller 9 controls the gas supply 5 and the RF power supply 8 so as to supply the nitrogen gas into the process chamber 1 from the shower head 3 and supply the RF power to the shower head 3. Thereby, a nitrogen plasma is generated in the process chamber 1, and the N group is formed on the surface of the substrate W.

Next, the controller 9 controls the components of the film forming apparatus so as to perform film forming step S13.

First, the controller 9 controls the components of the film forming apparatus so as to perform purging step S21. For example, the controller 9 controls the gas supply 5 so as to supply the inert gas into the process chamber 1 from the shower head 3. Thereby, the surface of the substrate W is purged.

Next, the controller 9 controls the components of the film forming apparatus so as to perform borazine-based gas supplying step S22. For example, the controller 9 controls the gas supply 5 so as to supply the borazine-based gas into the process chamber 1 from the shower head 3. Thereby, the borazine-based gas is adsorbed to the surface of the substrate.

Next, the controller 9 controls the components of the film forming apparatus so as to perform purging step S23. For example, the controller 9 controls the gas supply 5 so as to supply the inert gas into the process chamber 1 from the shower head 3. Thereby, the surface of the substrate W is purged.

Next, the controller 9 controls the components of the film forming apparatus so as to perform nitrogen plasma step S24. For example, the controller 9 controls the gas supply 5 and the RF power supply 8 so as to supply the nitrogen gas into the process chamber 1 from the shower head 3 and supply the RF power to the shower head 3. Thereby, a nitrogen plasma is generated in the process chamber 1, and the N group is formed on the surface of the substrate W.

Next, the controller 9 performs determining step S25. For example, the controller 9 determines whether or not a process from purging step S21 to nitrogen plasma step S24 has been performed a set number of times. When the process has not been performed the set number of times, the controller 9 controls the components of the film forming apparatus so as to perform the process from purging step S21 to nitrogen plasma step S24 again. When the process has been performed the set number of times, film forming step S13 ends. In this way, the controller 9 controls the components of the film forming apparatus so as to repeat the process of performing purging step S21 to nitrogen plasma step S24 in order until the process is performed the set number of times.

Next, the controller 9 increases the internal pressure of the process chamber 1 to the atmospheric pressure, and then controls the ascending and descending mechanism so as to descend the stage 2 to the transfer position. Subsequently, the controller 9 opens the gate valve 12 and discharges the substrate W from the process chamber 1 through the transfer port 11 by the unillustrated transfer arm. Through the above steps, the process for the single substrate W ends.

EXAMPLES

Examples of the present disclosure will be described below. In the Examples, the BN films formed by the film forming method according to the embodiment were evaluated for film properties.

Example 1

In Example 1, a BN film was formed by the film forming method according to the embodiment, and the formed BN film was measured for the relative permittivity. In Example 1, when the BN film was formed, the TMB gas was used as the borazine-based gas. In Example 1, for comparison, a BN film was formed using diborane ($B_2H_6$) gas instead of the borazine-based gas, and the formed BN film was measured for the relative permittivity. In Example 1, for comparison, a BN film was formed using an ammonia plasma instead of the nitrogen plasma, and the formed BN film was measured for the relative permittivity.

Figure 7:
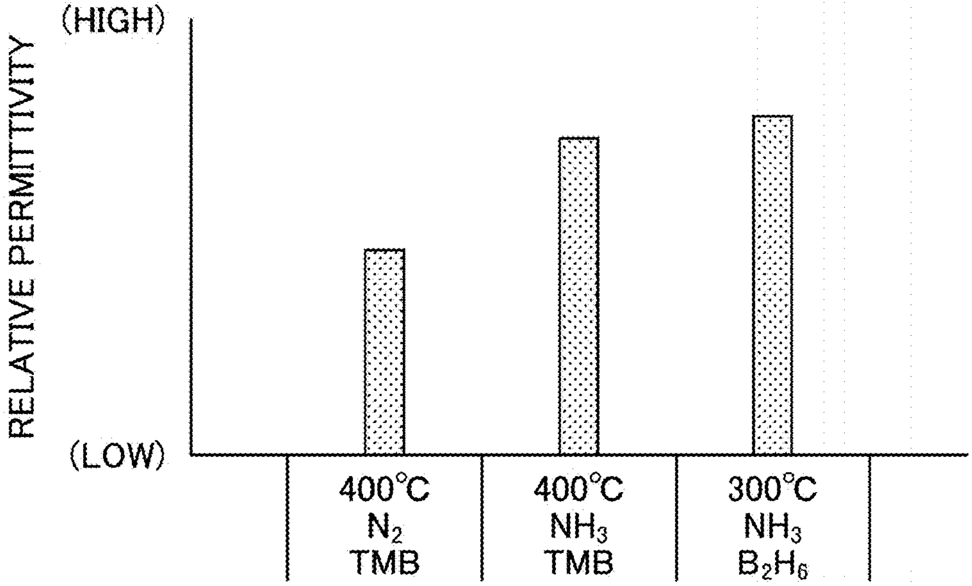
FIG. 7 is a graph illustrating a relative permittivity of a boron nitride (BN) film.

FIG. 7 is a view illustrating the relative permittivity of the BN films. The left-hand bar graph in FIG. 7 indicates the relative permittivity of the BN film formed by setting the substrate temperature to 400° C. and using the TMB gas and the nitrogen plasma. The middle bar graph in FIG. 7 indicates the relative permittivity of the BN film formed by setting the substrate temperature to 400° C. and using the TMB gas and the ammonia plasma. The right-hand bar graph in FIG. 7 indicates the relative permittivity of the BN film formed by setting the substrate temperature to 300° C. and using the diborane gas and the ammonia plasma.

As illustrated in FIG. 7, the relative permittivity of the BN film formed using the TMB gas and the nitrogen plasma is lower than the relative permittivity of the BN film formed using the TMB gas and the ammonia plasma and the relative permittivity of the BN film formed using the diborane gas and the ammonia plasma. This result indicates that use of the TMB gas and the nitrogen plasma can form the BN film having a low relative permittivity.

Example 2

In Example 2, a BN film was formed by the film forming method according to the embodiment, and the formed BN film was measured for the growth per cycle (GPC), i.e., the amount of the film formed per cycle. In Example 2, when the BN film was formed, the substrate temperature was maintained at 400° C. or 600° C. and the TMB gas was used as the borazine-based gas. In Example 2, for comparison, a BN film was formed using an ammonia plasma instead of the nitrogen plasma, and the formed BN film was measured for the GPC.

Figure 8:
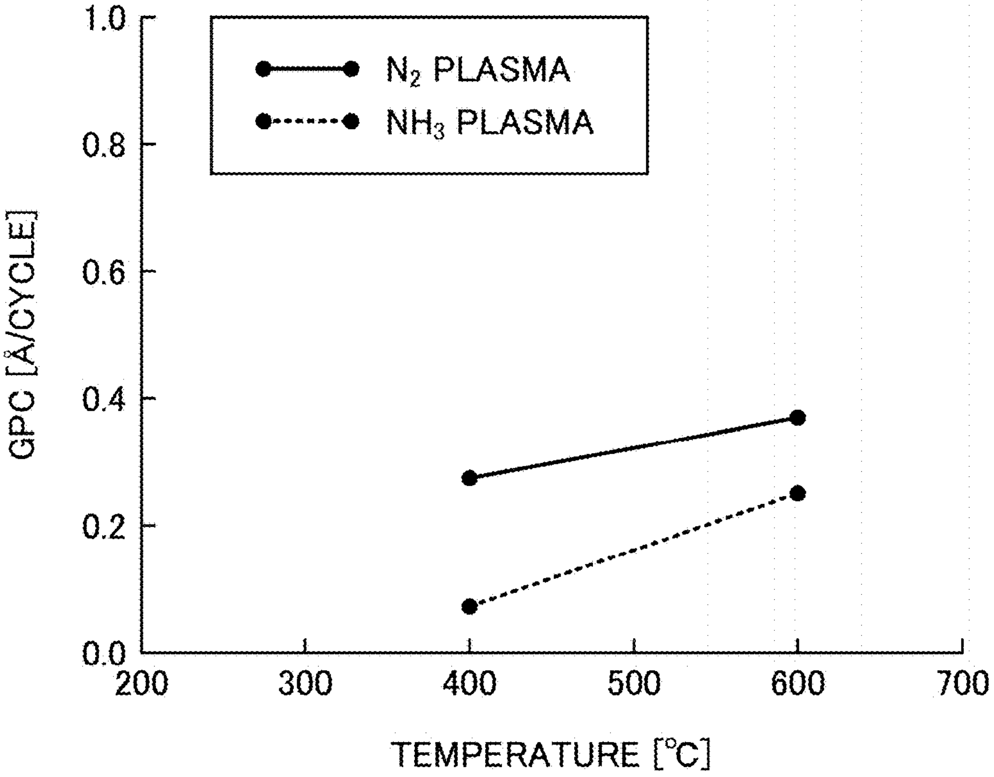
FIG. 8 is a graph illustrating a growth per cycle (GPC) of the BN film.

FIG. 8 is a view illustrating the GPC of the BN films. In FIG. 8, the horizontal axis indicates the substrate temperature [° C.], and the vertical axis indicates the GPC [angstroms/cycle] of the BN films. In FIG. 8, a solid line indicates the GPC in the case of using the nitrogen plasma, and a dashed line indicates the GPC in the case of using the ammonia plasma.

As illustrated in FIG. 8, in the case of using the nitrogen plasma, the GPC of the BN film formed at the substrate temperature of 400° C. was 0.27 angstroms/cycle and the GPC of the BN film formed at the substrate temperature of 600° C. was 0.37 angstroms/cycle. These results indicate that use of the nitrogen plasma can form the BN film in the relatively low temperature range that is 400° C. or higher and 600° C. or lower.

Meanwhile, as illustrated in FIG. 8, in the case of using the ammonia gas, the GPC of the BN film formed at the substrate temperature of 400° C. was 0.07 angstroms/cycle and the GPC of the BN film formed at the substrate temperature of 600° C. was 0.25 angstroms/cycle. This result suggests that use of the ammonia plasma has difficulty forming the BN film at 400° C.

Example 3

In Example 3, a BN film was formed by the film forming method according to the embodiment. In Example 3, when a BN film was formed, the substrate temperature was maintained at 400° C. and the TMB gas was used as the borazine-based gas. Also, through Fourier transform infrared spectroscopy (FTIR), the bonding state of the formed BN film was measured. Also, through transmission electron microscopy (TEM), a cross section of the formed BN film was observed.

Figure 9:
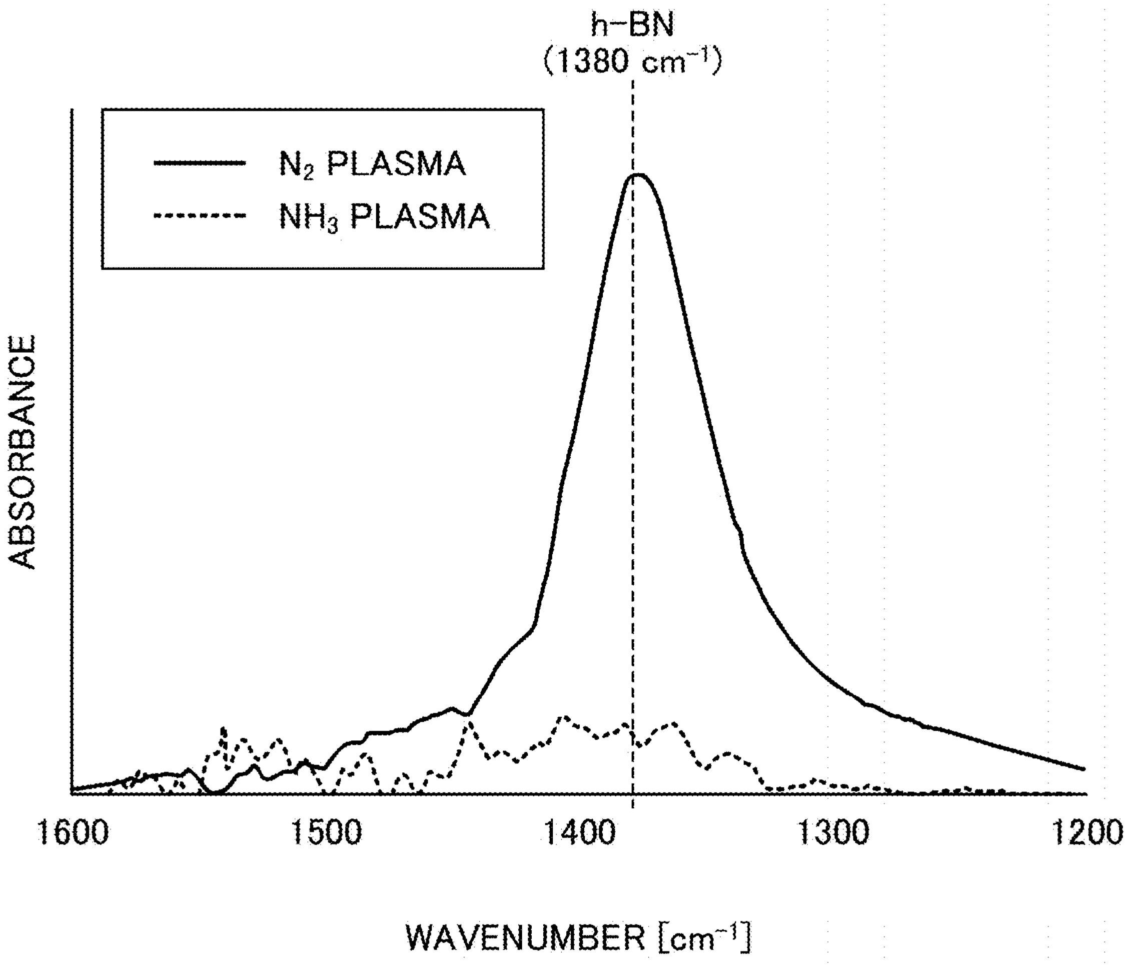
FIG. 9 is a graph illustrating a bonding state of the BN film.

FIG. 9 is a view illustrating the bonding state of the BN film and a FTIR spectrum of the BN film. In FIG. 9, the horizontal axis indicates wavenumber [$cm^{-1}$], and the vertical axis indicates absorbance. In FIG. 9, a solid line indicates absorbance of the BN film formed using the nitrogen plasma, and a dashed line indicates absorbance of the BN film formed using the ammonia plasma.

As illustrated in FIG. 9, in the case of using the nitrogen plasma, a peak attributed to hexagonal boron nitride (h-BN) appears, while in the case of using the ammonia plasma, no peak attributed to the h-BN appears.

Figure 10:
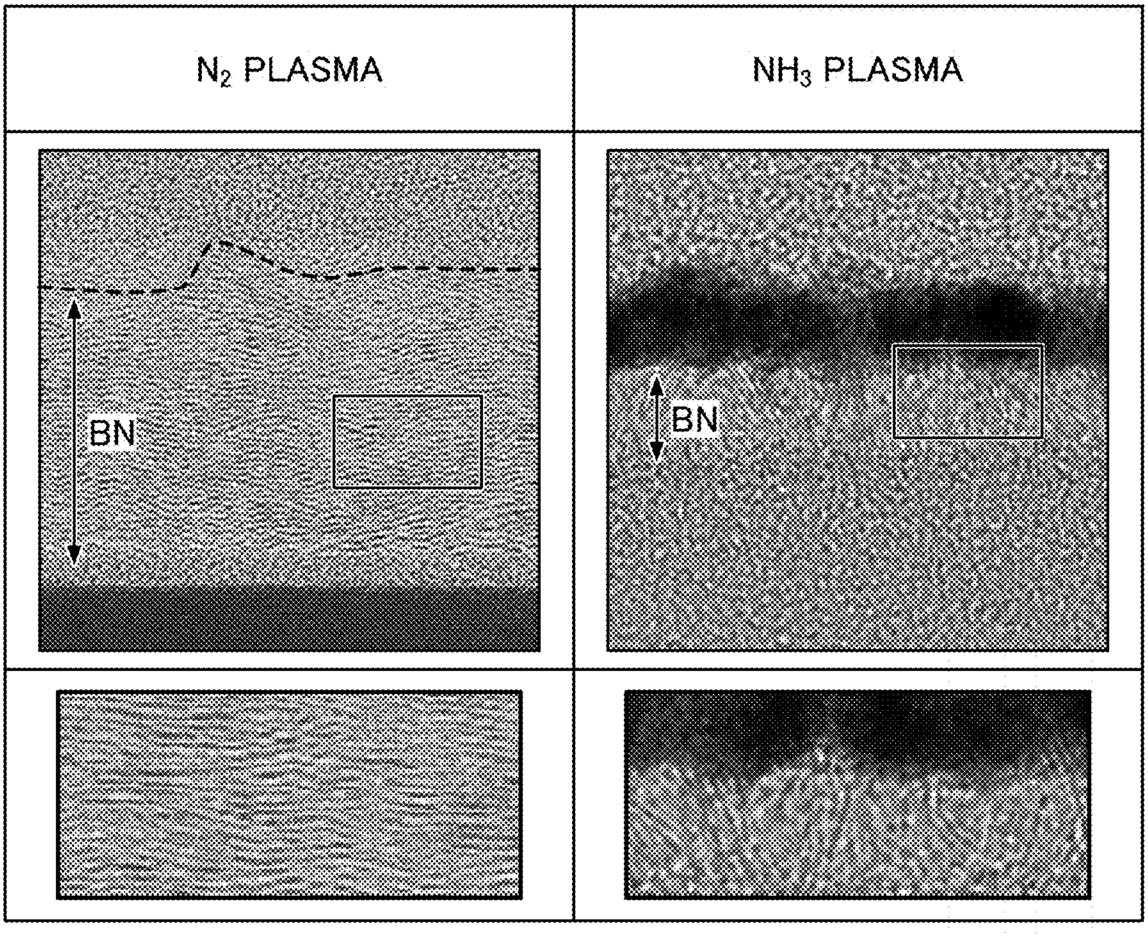
FIG. 10 is a view illustrating orientability of the BN film.

FIG. 10 is a view illustrating orientability of the BN film and a cross-sectional TEM image of the BN film. In FIG. 10, the left-hand images indicate the cross-sectional TEM image of the BN film formed using the nitrogen plasma, and the right-hand images indicate the cross-sectional TEM image of the BN film formed using the ammonia plasma. In FIG. 10, the lower images are enlarged images of regions enclosed by solid lines in the upper images.

As illustrated in FIG. 10, the BN film formed using the nitrogen plasma is laterally grown (in the form of a layer), while the BN film formed using the ammonia plasma is randomly grown.

The results indicated in FIG. 9 and FIG. 10 suggest that the BN film formed using the TMB gas and the nitrogen plasma is two-dimensionally (2D) grown by cyclic structural units being bonded together.

Example 4

In Example 4, through X-ray photoelectron spectroscopy (XPS) , the BN film formed under the same conditions as in Example 3 was measured for the film composition.

Figure 11:
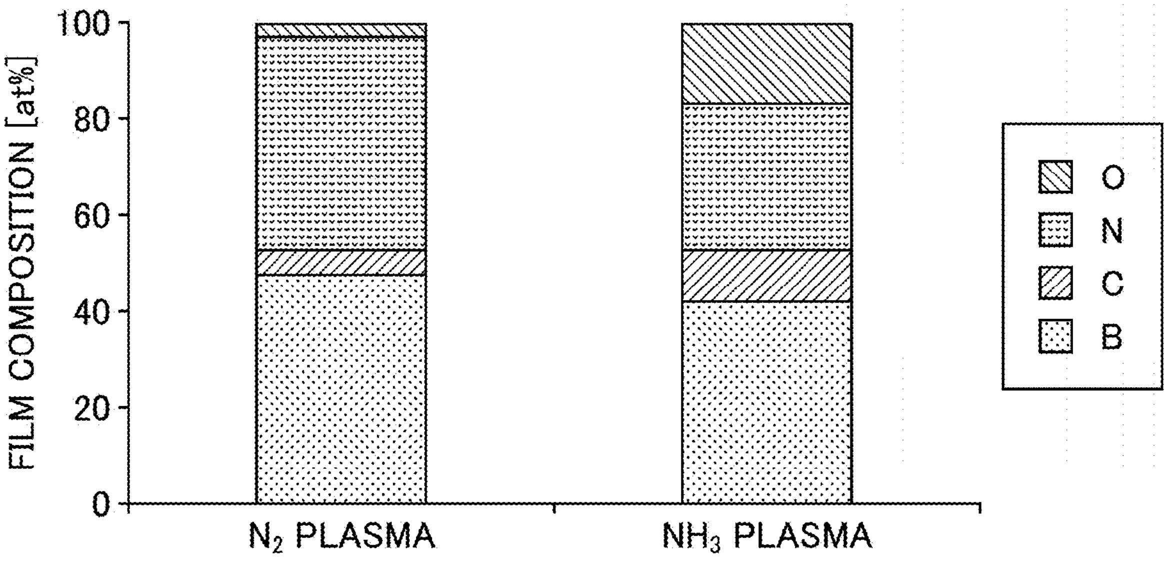
FIG. 11 is a graph illustrating a film composition of the BN film.

FIG. 11 is a view illustrating the film composition of the BN film. FIG. 11 indicates proportions [at %] of boron (B), carbon (C), nitrogen (N), and oxygen (O) included in the BN film formed using the nitrogen plasma and the BN film formed using the ammonia plasma.

As illustrated in FIG. 11, the proportions of oxygen and carbon in the BN film are lower in the case of using the nitrogen plasma than in the case of using the ammonia plasma. Also, a boron (B)/nitrogen (N) ratio calculated from the results of the film composition as illustrated in FIG. 11 was 1.07 in the case of using the nitrogen plasma and was 1.37 in the case of using the ammonia plasma. The B/N ratio that is closer to 1.00 indicates that the two-dimensional (2D) growth of the cyclic structural units bonded together is more promoted. This result suggests that the carbon in the BN film is abstracted by the nitrogen plasma and the two-dimensional (2D) growth of the cyclic structural units bonded together is promoted, thereby increasing oxidation resistance of the BN film. Meanwhile, in the case of using the ammonia plasma, it is suggested that the formed BN film includes a C—B bond and a $CH_3$ group, and the proportion of oxygen included in the BN film increases through oxidation in open air.

Example 5

In Example 5, the BN film formed under the same conditions as in Example 3 was measured for the wet etching rate (WER). In Example 5, the WER was defined as an etching rate of the BN film when the substrate having the BN film formed was immersed in 0.5% hydrofluoric acid (HF).

Figure 12:
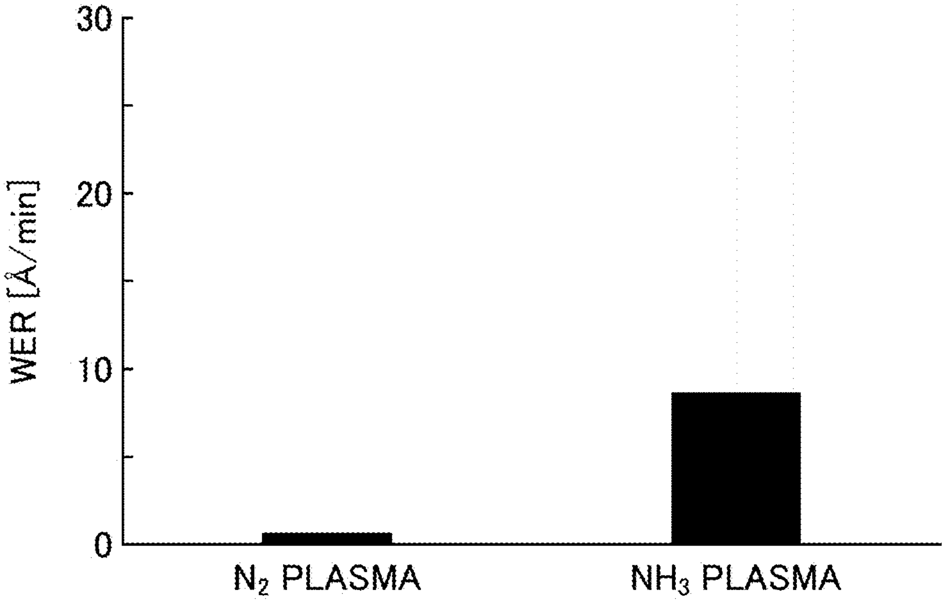
FIG. 12 is a graph illustrating a wet etching rate (WER) of the BN film.

FIG. 12 is a view illustrating the WER of the BN film, and the WER [angstroms/min] of the BN film formed using the nitrogen plasma and the BN film formed using the ammonia plasma.

As illustrated in FIG. 12, the WER of the BN film formed using the nitrogen plasma is lower than 0.5 angstroms/min, while the WER of the BN film formed using the ammonia plasma was 8.4 angstroms/min. These results indicate that the BN film formed using the nitrogen plasma has an etching resistance to hydrofluoric acid higher than the BN film formed using the ammonia plasma.

According to the present disclosure, it is possible to form a film including a boron atom and a nitrogen atom at a low temperature.

It should be understood that the embodiments disclosed herein are illustrative and not restrictive in all respects. Various omissions, substitutions, and changes may be made to the above-described embodiments without departing from the scope of claims recited and the spirit of the present disclosure.

The above-described embodiments are related to embodiments in which the film forming apparatus is a single substrate processing apparatus configured to process one substrate by one substrate, but the present disclosure is not limited thereto. For example, the film forming apparatus may be a batch-type film forming apparatus configured to perform a process to a plurality of substrates all at once.

What is claimed is:

1. A film forming method comprising:

providing a substrate;

exposing the substrate to a nitrogen plasma, thereby generating a nitrogen group on the substrate; and after exposing the substrate to the nitrogen plasma, forming a film on a surface of the substrate, the film including a boron atom and a nitrogen atom, wherein the forming of the film on the surface of the substrate includes:

a) supplying first inert gas to the surface of the substrate, thereby purging the surface of the substrate;

b) supplying borazine-based gas to the substrate without exposing the substrate to the nitrogen plasma, thereby adsorbing the borazine-based gas to the substrate;

c) supplying second inert gas to the surface of the substrate, thereby purging the surface of the substrate;

d) exposing the substrate to the nitrogen plasma without exposing the substrate to the borazine-based gas; and e) performing a), b), c), and d) in this order multiple times, and wherein a) is first performed in each cycle of a), b), c), and d).

2. The film forming method according to claim 1, wherein d) includes generating the nitrogen group on the surface of the substrate.

3. The film forming method according to claim 1, wherein b) includes supplying the borazine-based gas into a process chamber housing the substrate, and after supplying the borazine-based gas into the process chamber, retaining a state where both the supply of the borazine-based gas into the process chamber housing the substrate and discharge of the borazine-based gas from the process chamber are stopped.

4. The film forming method according to claim 1, wherein the borazine-based gas is 1,3,5-trimethylborazine gas.

5. The film forming method according to claim 2, wherein the borazine-based gas is 1,3,5-trimethylborazine gas.

6. The film forming method according to claim 3, wherein the borazine-based gas is 1,3,5-trimethylborazine gas.

7. A film forming apparatus comprising:

a process chamber;

a gas supply configured to supply gas into the process chamber; and a controller configured to perform:

providing a substrate;

exposing the substrate to a nitrogen plasma, thereby generating a nitrogen group on the substrate; and after exposing the substrate to the nitrogen plasma, forming a film on a surface of the substrate, the film including a boron atom and a nitrogen atom, wherein the forming of the film on the surface of the substrate includes, in the process chamber, a) supplying first inert gas to the surface of the substrate, thereby purging the surface of the substrate, b) supplying borazine-based gas to the substrate without exposing the substrate to the nitrogen plasma, thereby adsorbing the borazine-based gas to the substrate, c) supplying second inert gas to the surface of the substrate, thereby purging the surface of the substrate, d) exposing the substrate to the nitrogen plasma without exposing the substrate to the borazine-based gas, and e) performing a), b), c), and d) in this order multiple times, and wherein a) is first performed in each cycle of a), b), c), and d).

* * * * *